United States Patent [19]

Rohner

[11] Patent Number: 5,225,040
[45] Date of Patent: Jul. 6, 1993

[54] PROCESS FOR PATTERNING METAL CONNECTIONS IN SMALL-GEOMETRY SEMICONDUCTOR STRUCTURES

[75] Inventor: Don R. Rohner, San Diego, Calif.

[73] Assignee: Raytheon Company, Lexington, Mass.

[21] Appl. No.: 733,522

[22] Filed: Jul. 22, 1991

Related U.S. Application Data

[63] Continuation of Ser. No. 509,652, Apr. 16, 1990, abandoned.

[51] Int. Cl.$^5$ ............................................. H01L 21/00
[52] U.S. Cl. ................................... 156/652; 156/656; 156/665; 437/228; 437/246; 437/192; 437/194
[58] Field of Search .................. 156/656, 652, 665; 437/192, 194, 246, 228

[56] References Cited

U.S. PATENT DOCUMENTS

| | | | |
|---|---|---|---|
| 4,267,012 | 5/1981 | Pierce et al. | 156/643 |
| 4,670,091 | 6/1987 | Thomas et al. | 156/656 X |
| 4,782,380 | 11/1988 | Shankar et al. | 437/192 X |
| 4,824,521 | 4/1989 | Kulkarni et al. | 156/656 X |
| 4,917,759 | 4/1990 | Fisher et al. | 156/656 X |
| 4,920,072 | 4/1990 | Keller et al. | 437/192 |
| 4,997,789 | 3/1991 | Keller et al. | 437/192 |

*Primary Examiner*—Thi Dang
*Attorney, Agent, or Firm*—Richard M. Sharkansky; William R. Clark

[57] ABSTRACT

A technique for removing unwanted portions of a metallization layer in a semiconductor structure, without damage to underlying protective layers of silicon dioxide. The metallization layer is formed with an underlying etch stop layer of titanium-tungsten, the removal of which is effected by a very thin layer of aluminum formed beneath the titanium-tungsten. After removal of unwanted portions of the metallization layer, using a plasma etch to which the titanium-tungsten is resistant, corresponding portions of the titanium tungsten layer are removed using a plasma-etch to which aluminum is resistant. The thin aluminum layer functions as a highly effective etch stop in the removal of titanium-tungsten, but is so thin that there is negligible penetration of aluminum into underlying contact regions.

3 Claims, 1 Drawing Sheet

PROCESS FOR PATTERNING METAL CONNECTIONS IN SMALL-GEOMETRY SEMICONDUCTOR STRUCTURES

This is a continuation of application Ser. No. 07/509,652, filed Apr. 16, 1990, now abandoned.

BACKGROUND OF THE INVENTION

This invention relates generally to epitaxial fabrication of semiconductor structures and, more particularly, to processes for patterning metal connections on semiconductor structures. In bipolar semiconductor circuitry, aluminum or a similar material is typically used as a metallic conductive layer, to establish connections with underlaying semiconductor layers. Contact regions, with which electrical connection are to be established, are capped with a contact material, such as platinum silicide, before the aluminum layer is applied. Non-contact regions are coated with a protective layer of silicon dioxide before the aluminum layer is applied; then the aluminum is selectively removed from the non-contact regions.

A well known difficulty in the processing of aluminum metallization layers in this way is that the aluminum, in contact with such materials as platinum silicide will penetrate the contact material when the structure is heated. To prevent this unwanted penetration of the aluminum, a common practice is to employ an alloy of titanium and tungsten (TiW) beneath the aluminum layer. The TiW material does not penetrate the contact regions, and can also serve as an etch stop layer during removal of the aluminum from the non-contact regions. For example, U.S. Pat. No. 4,267,012 to Pierce et al. describes a process in which a TiW alloy is used as an etch stop layer for the removal of undesired portions of an aluminum layer. The TiW layer is then itself removed by an etching process, such as wet chemical etching.

In recent years, the lateral dimensions and spacings of semiconductor regions have become smaller and smaller, as fabrication techniques have improved and device densities have increased. With the decrease in lateral dimensions, usually referred to as device "geometry," layer thicknesses have also become smaller. In particular, the protective layers of silicon dioxide formed over non-contact regions may be so thin that the removal of the TiW stop etch layer becomes a much more critical process step. A strong wet etch may eat significantly into the silicon dioxide. Plasma etching materials available for etching the TiW alloy are, unfortunately, not selective with respect to silicon dioxide. Once the TiW layer is etched away, the plasma etch will immediately begin attacking the silicon dioxide, and underlying active devices in the structure can be exposed. Timing of the etch step is, therefore, very critical and practically impossible to control if the silicon dioxide layer is extremely thin. This processing difficulty effectively limits the thickness of the silicon dioxide layer and, indirectly, the attainable device geometry.

It will be appreciated from the foregoing that there is a need for improvement in the process steps of applying a metallization layer to semiconductor structures. The present invention is directed to this end.

SUMMARY OF THE INVENTION

The present invention resides in an improved process for removing unwanted portions of an aluminum metallization layer from a semiconductor structure. Briefly, and in general terms, the process of the invention includes the steps of forming a thin layer of aluminum, or a mixture of metals including aluminum, over a semiconductor structure, forming a layer of titanium-tungsten (TiW) over the thin layer of aluminum, forming a metallization layer over the TiW layer, and then removing those unwanted portions of the metallization layer, the TiW layer and the thin aluminum layer that are not over contact regions of the semiconductor structure. Specifically, these removing steps include removing the unwanted portions of the metallization layer using a plasma etching process to which the TiW layer is resistant, removing corresponding unwanted portions of the TiW layer using a plasma etching process to which the thin aluminum layer is resistant, and finally, removing corresponding unwanted portions of the thin aluminum layer.

The process may also include the conventional steps of forming a photoresist layer over the metallization layer, and patterning the photoresist layer to expose the unwanted portions of the metallization layer. The patterning step defines the unwanted portions of the layers underlying the photoresist layer. Remaining portions of the photoresist layer function conventionally to protect selected contact regions from the subsequent plasma etching steps.

In the presently preferred embodiment of the invention, the thickness of the thin aluminum layer is approximately 50-70 Angstroms but the maximum allowable thickness is very much dependent on the nature of the underlying semiconductor structure.

It will be appreciated from the foregoing that the present invention represents a significant advance in the field of fabrication of semiconductor structures, especially those having requirements for extremely small device geometries and layer thicknesses. In particular, the invention allows the removal of unwanted portions of a metallization layer without damage to underlying layers. Other aspects and advantages of the invention will become apparent from the following more detailed description, taken in conjunction with the accompanying drawings.

DESCRIPTION OF THE PREFERRED EMBODIMENT

Figure 1:
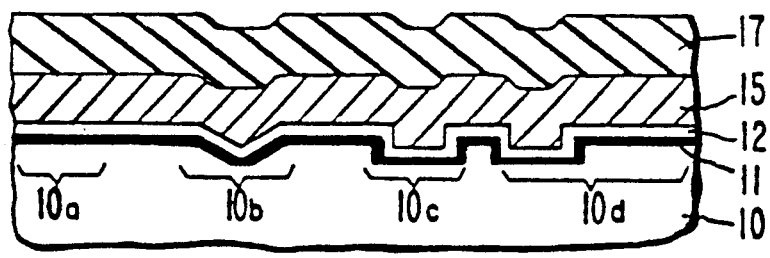
FIG. 1 is a cross-sectional view of a semiconductor structure in accordance with the invention, including a photoresist layer, an aluminum layer, a titanium-tungsten layer resistant to plasma-etching of the aluminum, and a thin aluminum layer resistant to plasma-etching of the titanium-tungsten layer.

As shown in the drawings for purposes of illustration, the present invention is concerned with a process for selective removal of a metallization layer from non-contact regions of a semiconductor structure. In the past, selective removal of aluminum from a semiconductor structure has been facilitated by use of titanium-tungsten (TiW) alloy as a stop etch layer formed beneath the aluminum. In structures having very small device geometries, removal of the TiW stop etch layer cannot be effected without risk of damage to the underlying layer, which is typically a protective silicon dioxide layer in the non-contact regions.

In accordance with the invention, removal of the TiW layer is effected by means of an underlying very thin layer of aluminum, which functions as a stop etch layer for the plasma-etching of the TiW. The thin aluminum layer is then removed with a weak wet etch, or by other means.

FIG. 1 is a cross-sectional view of a typical semiconductor structure, indicated by reference numeral 10. It will be appreciated that the structure 10 may include many semiconductor layers and regions formed in a series of processing steps that have little to do with the present invention. The structure 10 includes a number of contact regions, indicated at 10a, 10b, 10c and 10d, which are typically formed from platinum silicide or similar material. For convenience, regions of the structure that are not contact regions will be referred to as non-contact regions, and these are the regions for which no contact is to be made with a metallization layer. Overlying the surface of the structure 10 is a very thin layer 11 of aluminum. This layer has to be thin enough that it will not penetrate the contact regions 10a, 10b, 10c, 10d in any significant way. Overlying the thin aluminum layer 11 is a thicker layer 12 of TiW. Formed on top of the TiW is an aluminum metallization layer 15, and on top of that is a photoresist layer 17.

Figure 2:
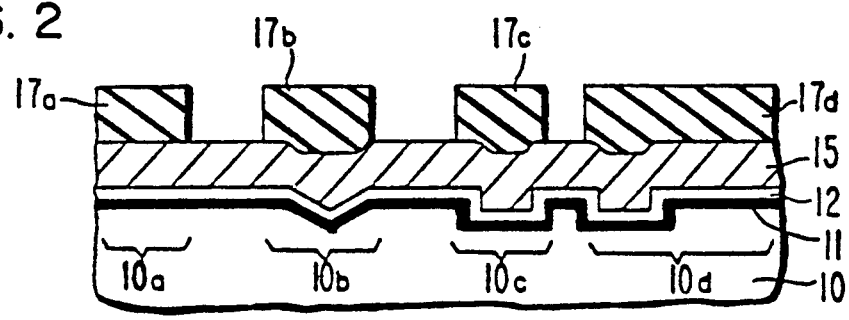
FIG. 2 is a cross-sectional view similar to FIG. 1, after patterning of the photoresist layer.
Figure 3:
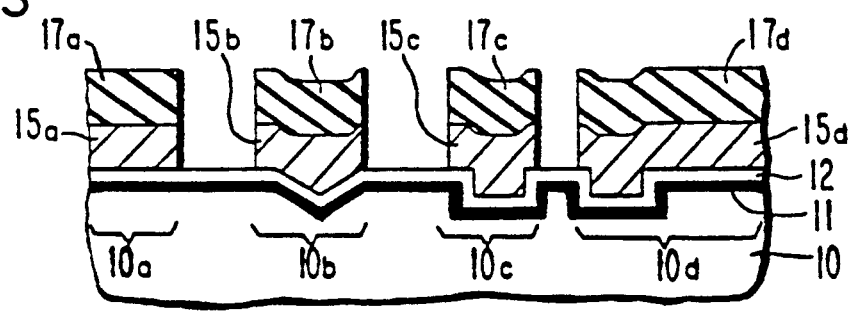
FIG. 3 is a cross-sectional view similar to FIG. 2, after removal of unwanted portions of the aluminum layer.

The photoresist layer 17 is patterned using conventional photolithographic process steps, and portions of the layer are removed over each of the non-contact regions of the semiconductor structure. This step leaves portions of the photoresist layer over the contact regions, as indicated at 17a, 17b, 17c and 17d in FIG. 2. The next step is the removal of the unwanted portions of the aluminum metallization layer 15, as shown in FIG. 3. A chlorine-based plasma etching process is used, and the TiW layer 12 is functions as an etch stop layer in this step. This leaves the structure basically as shown in FIG. 3, and a further step is required to remove unwanted portions of the TiW layer 12.

Plasma etch materials that will etch away TiW will also etch silicon dioxide in the non-contact regions. However, the same plasma etch materials will not attack aluminum, and the thin layer 11 of aluminum functions as an etch stop layer for this step of the process, completely protecting any underlying materials, in particular silicon dioxide.

It might at first seem anomalous to use an aluminum layer next to the contact regions of the semiconductor structure 10, since one of the reasons for using a TiW layer was to avoid contamination of the contact regions 10a-10d with penetrating aluminum. However, the extreme thinness of the layer 11 ensures that any contamination of the contact regions is negligible. Moreover, the selectivity of the plasma etching of TiW is such that only a very thin layer of aluminum is needed as an etch stop. The aluminum layer 11 effectively grounds the plasma and prevents further etching from occurring. Therefore, the timing of this etching step is not in the least critical.

Although various thicknesses of the aluminum layer 11 will perform with the desired characteristics, a thickness of 50–70 Angstroms has provided satisfactory operation. Greater thicknesses may be tolerated, depending on the nature of the underlying semiconductor structure 10, particularly the contact regions 10a–10d.

Figure 4:
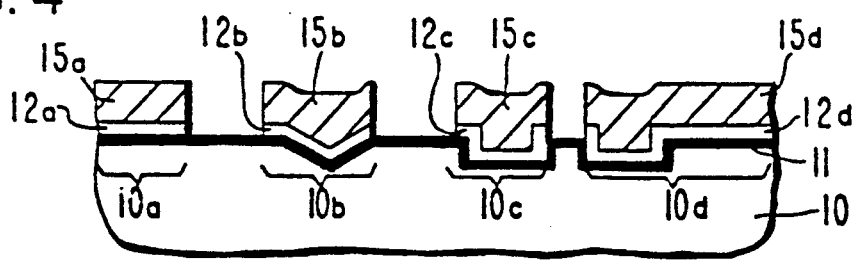
FIG. 4 is a cross-sectional view similar to FIG. 3, after removal of unwanted portions of the titanium-tungsten layer.
Figure 5:
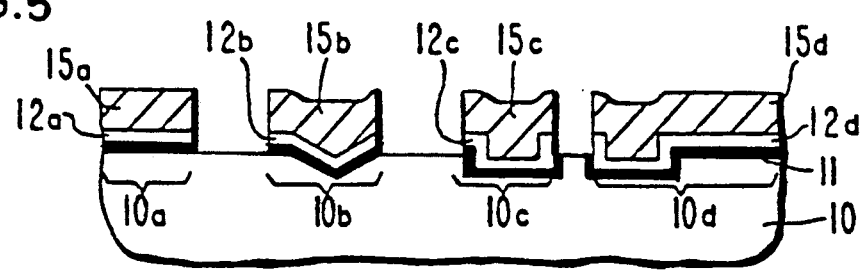
FIG. 5 is a cross-sectional view similar to FIG. 4, after removal of unwanted portions of the thin aluminum layer.

After removal of the TiW layer 12, the structure looks basically as shown in FIG. 4. The only remaining step is the removal of the thin aluminum layer 11. Since this layer is so thin, it can be removed with a very weak wet chemical etch without significant risk of damage to the underlying materials, leaving the finished structures as shown in FIG. 5. Alternatively, the thin aluminum layer 11 can be plasma etched away without difficulty, since the aluminum plasma etch is selective with respect to silicon dioxide. In fact, the plasma etch of aluminum is about eight times more selective than the plasma etch of TiW, with respect to silicon dioxide. Therefore, silicon dioxide layers in the structure 10 can be reduced by a factor of eight compared with previous structures not employing the present invention.

Use of the invention permits the reduction of device geometries in a number of semiconductor processes, including bipolar, NMOS, CMOS and JFET structures that need reduced underlying silicon dioxide layers in order to optimize performance.

It will be appreciated from the foregoing that the present invention represents a significant improvement in the field of semiconductor fabrication. In particular, the invention provides a useful technique for removing unwanted portions of an aluminum metallization layer without damage to underlying structures, particularly silicon dioxide layers in the non-contact regions of the structure. This is of particular significance to semiconductor structures employing small device geometries.

It will also be appreciated that, although an embodiment of the invention has been described in detail for purposes of illustration, various modifications may be made without departing from the spirit and scope of the invention. For example, although the invention has been described as including a thin aluminum etch stop layer, it will be understood that aluminum derivatives, including mixtures such as aluminum-copper (Al-Cu), aluminum-copper-silicon (Al-Cu-Si), and aluminum-silicon-titanium (Al-Si-Ti), may also be used. Accordingly, the invention is not to be limited except as by the appended claims.

I claim:

1. A process for removing unwanted portions of a metallization layer in a semiconductor structure, comprising the steps of:

forming a continuous thin layer of aluminum, or a mixture of metals including aluminum, over a semiconductor structure wherein the thin aluminum layer has a thickness of approximately 50–70 angstroms;

then forming a continuous layer of titanium-tungsten (TiW) over the thin layer of aluminum;

then forming a continuous metallization layer over the TiW layer;

then removing unwanted portions of the metallization layer using a plasma etching process to which the TiW layer is resistant, wherein the TiW layer serves as a stop etch layer in the removal of unwanted portions of the metallization layer;

then removing unwanted portions of the TiW layer using a plasma etching process to which the thin aluminum layer is resistant, wherein the thin aluminum layer serves as a stop etch layer in the removal of unwanted portions of the TiW layer; and removing unwanted portions of the thin aluminum layer.

2. A process as defined in claim 1, and further comprising the following additional steps performed prior to removing unwanted portions of the metallization layer:

forming a photoresist layer over the metallization layer; and patterning the photoresist layer to expose the unwanted portions of the metallization layer.

3. A process for removing unwanted portions of a metallization layer in a semiconductor structure, without damage to underlying layers in the structure, the process comprising the steps of:

forming a continuous layer of aluminum over a semiconductor structure, said continuous layer of aluminum having a thickness within the range of approximately 50 angstroms to approximately 70 angstroms;

then forming a continuous layer of titanium-tungsten (TiW) over the continuous layer of aluminum;

then forming a metallization layer of aluminum over the TiW layer;

then forming a photoresist layer over the metallization layer;

then patterning the photoresist layer to expose unwanted portions of the metallization layer;

then removing the unwanted portions of the metallization layer using a plasma etching process to which the TiW layer is resistant, wherein the TiW layer serves as a stop etch layer in the removal of unwanted portions of the metallization layer;

then removing unwanted portions of the TiW layer using a plasma etching process to which the continuous aluminum layer is resistant, wherein the continuous aluminum layer serves as a stop etch layer in the removal of unwanted portions of the TiW layer; and then removing unwanted portions of the continuous aluminum layer.

* * * * *